US007036058B1

(12) United States Patent
Miyachi et al.

(10) Patent No.: US 7,036,058 B1
(45) Date of Patent: Apr. 25, 2006

(54) SEMICONDUCTOR DEVICE HAVING INTEGRALLY SEALED INTEGRATED CIRCUIT CHIPS ARRANGED FOR IMPROVED TESTING

(75) Inventors: Kumi Miyachi, Tenri (JP); Toshifumi Yamashita, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 505 days.

(21) Appl. No.: 09/615,956

(22) Filed: Jul. 13, 2000

(30) Foreign Application Priority Data

Nov. 9, 1999 (JP) .......................................... 11-318485

(51) Int. Cl.
*G01R 31/28* (2006.01)
*G01R 27/28* (2006.01)

(52) U.S. Cl. ...................................... 714/724; 324/73.1
(58) Field of Classification Search ................. 714/724, 714/727, 734; 324/73
See application file for complete search history.

(56) References Cited

U.S. PATENT DOCUMENTS

| 5,068,886 | A | * | 11/1991 | Lavia | ........................... | 378/164 |
|---|---|---|---|---|---|---|
| 5,621,740 | A | * | 4/1997 | Kamada | ...................... | 714/727 |
| 5,627,842 | A | * | 5/1997 | Brown et al. | ................ | 714/727 |
| 5,808,877 | A | * | 9/1998 | Jeong et al. | ................. | 361/813 |
| 5,978,945 | A | * | 11/1999 | Muris | ........................ | 714/727 |
| 6,000,051 | A | * | 12/1999 | Nadeau-Dostie et al. | ... | 327/144 |
| 6,006,343 | A | * | 12/1999 | Whetsel | ......................... | 714/28 |
| 6,058,602 | A | * | 5/2000 | Fehr | ............................ | 29/827 |
| 6,163,867 | A | * | 12/2000 | Miller et al. | ................... | 714/36 |
| 6,199,182 | B1 | * | 3/2001 | Whetsel | ....................... | 714/724 |
| 6,260,165 | B1 | * | 7/2001 | Whetsel | ...................... | 714/727 |

FOREIGN PATENT DOCUMENTS

| JP | 55-111151 | A | 8/1980 |
|---|---|---|---|
| JP | 03-246475 | A | 1/1991 |
| JP | 04-211842 | A | 8/1992 |
| JP | A5322988 | | 12/1993 |
| JP | 09-186418 | A | 7/1997 |

OTHER PUBLICATIONS

Karrfalt J. et al., "A Novel Approach to Optimizing IEEE 1149.1 for Systems with Multiple Embedded Cores," 2nd IEEE International Workshop of Testing Embedded Core-Based System BHIPS, Oct. 22–23, 1998, pp. 2.2–1—2.2–10, Washington, DC, USA.
CQ Publishing Co., "Fundamentals and Applications of JTAG Test", pp. 11–28 (Dec. 1, 1998).

\* cited by examiner

*Primary Examiner*—Albert Decady
*Assistant Examiner*—Esaw Abraham
(74) *Attorney, Agent, or Firm*—Birch, Stewart, Kolasch, & Birch, LLP

(57) ABSTRACT

Each chip includes, in addition to a core logic, a register such as a BSR. A TAPC for controlling the register is provided only on a chip of the first stage, and an test commands/data output and input signal lines for the boundary scan test are connected to each other via wire to form a loop. Other signal lines used in the test are distributed from an output signal line of the chip of the first stage. As a result, the test needs to be carried out only once with a smaller number of pins and the number of steps and area can be reduced in chips not provided with TAPC. With this arrangement, in a stacked device in which a plurality of chips are integrally sealed, the boundary scan test only needs to be carried out once with a smaller number of pins.

12 Claims, 7 Drawing Sheets

US 7,036,058 B1

SEMICONDUCTOR DEVICE HAVING INTEGRALLY SEALED INTEGRATED CIRCUIT CHIPS ARRANGED FOR IMPROVED TESTING

FIELD OF THE INVENTION

The present invention relates to a semiconductor device in which a plurality of semiconductor integrated circuit chips are integrally sealed, and in particular to a structure for performing a test thereon.

BACKGROUND OF THE INVENTION

In recent years, in response to high integration of semiconductor integrated circuit chips, the number of pins in devices (semiconductor device) such as IC and LSI has been increasing. Meanwhile, demand for mounting these devices on a substrate in high density has also been increasing, fostering the advancement of a smaller package. As a result, in testing of these devices, the pin interval becomes less than the diameter of a probe used in the test, which makes it difficult to employ a so-called in-circuit method, which has been conventionally used to perform measurements by bringing a probe into contact with a pattern surface of a print substrate.

In the light of this problem, a unique measure has been taken to change positions of test pads, which, however, requires an additional substrate space, preventing high density mounting. Also, in a BGA (Ball Grid Array) package, a ball lead is disposed on a rear surface of the package and once surface mounting is secured, it becomes impossible to make a probe contact.

The above problem becomes especially notable when the number of pins is increased in response to high integration in what is called a stacked package in which a plurality of semiconductor integrated circuit chips are provided in a stacked structure of upper and lower layers or multiple layers, or a multi-chip module in which semiconductor integrated circuit chips are disposed on a plane surface.

To solve these problems, there has been development of a boundary scan testing method as a new testing method for a substrate mounting a plurality of IC packages, which is called a JTAG test or which is in accord with IEEE 1149.1. In recent years, virtually all micro processors as well as some of the peripheral circuits are made compatible with this boundary scan test. The boundary scan test is a method for testing whether pins of IC or LSI package devices mounted on a print substrate are properly connected by feeding signals from a tester such as an external host computer of the print substrate.

A device compatible with the boundary scan test has a structure, for example, as shown in FIG. 6, and it includes, in addition to a core logic 1 for realizing an intended function of the device, a boundary scan register ("BSR" hereinafter) 2, instruction register 3, bypass register 4, option register 5, test access port ("TAP" hereinafter) 6 for controlling these elements, and controller ("TAPC" hereinafter) 7 for controlling the TAP 6. The core logic 1 may have any arrangement.

The TAP 6 is a serial interface which performs input and output of commands, data, and test result with respect to the core logic 1, and in accordance with the specifications of the boundary scan test, it includes five signal lines TDI, TDO, TCK, TMS, and TRST, of which TRST is optional. The BSR 2 is made up of a serially connected shift registers 2s called "cells", which are provided between pins 8 and input and output terminals of the core logic 1, and the shift registers 2s perform a function equivalent to that of a conventional probe and connect the signal lines TDI and TDO and the input and output terminals of the core logic 1. Between the signal lines TDI and TDO are provided the bypass register 4, instruction register 3, and option register 5, which are disposed parallel to each other.

The TDI is a signal line for serially inputting commands and data with respect to the core logic 1, and TDO is a signal line for serially outputting data from the core logic 1, and TCK is a signal line for supplying a test clock independently from a system clock which is exclusive to the core logic 1, and TMS is a signal line for controlling a test operation, and TRST is a signal line for initializing the TAPC to be asynchronous. The boundary scan test is enabled by controlling these five signal lines with an external host computer.

The boundary scan test is discussed, for example, in "*Fundamentals and Applications of JTAG Test*" (published by CQ Publishing Co.; published date: Dec. 1, 1998) and Japanese Unexamined Patent Publication No. 322988/1993 (Tokukaihei 5-322988) (published date: Dec. 7, 1993).

FIG. 7 is a drawing explaining a method of a conventional boundary scan test. On a print substrate 11 to be subjected to the test are mounted a plurality of devices IC1, IC2, ..., and ICn (will be indicated by reference symbol "IC" when referring to the chips in general). On a periphery of the print substrate 11 is mounted a connector 12, which is connected to a host computer 13.

In each device IC, pins corresponding to the signal lines TCK, TMS, and TRST are connected, parallel to each other, via a pattern formed on the print substrate 11, to their corresponding pins of the connector 12. Meanwhile, with regard to pins corresponding to the signal lines TDI and TDO, a pin corresponding to the signal line TDO and a pin corresponding to the signal line TDI are successively and serially connected to each other between devices of preceding and following stages, and a pin corresponding to the signal line TDI of the device of the first stage and a pin corresponding to the signal line TDO of the device of the last stage are connected to their corresponding pins of the connector 12, respectively.

In the print substrate 11 structured as above, each device IC is controlled by the host computer 13 so as to carry out the boundary scan test all at once with respect to all the device ICs. Note that, a discrete function test of each device is individually performed one after another for each device IC using other pins.

However, in devices such as the stacked device or multichip module in which a plurality of semiconductor integrated circuit chips are integrally sealed, so long as the chips are integrally sealed, in order to enable the boundary scan test, each chip requires the five signal lines as noted above and the number of pins provided becomes large, and in response to this increase in the pin number, the test pattern length on the substrate is increased. Further, the test needs to be performed for the number of chips provided.

SUMMARY OF THE INVENTION

It is an object of the present invention to provide a semiconductor device in which a test needs to be carried out only once with a smaller number of pins in a structure where a plurality of semiconductor integrated circuit chips are integrally sealed.

In order to achieve the foregoing object, a semiconductor device of the present invention includes:

a plurality of chips, which are integrally sealed;

a test signal input terminal for receiving an externally supplied test signal;

a test result output terminal for outputting a test result of the plurality of chips to outside; and control signal input terminals for receiving externally supplied test control signals, the test signal inputted from the test signal input terminal being successively transferred through the plurality of chips, and the test control signals inputted from the control signal input terminals being individually supplied to each of the plurality of chips.

With this arrangement, a plurality of chips are integrally sealed. In a semiconductor device made up of a plurality of chips, pins are packed very closely in high density, which prevented accurate testing by the conventional in-circuit method. In the light of this problem was developed a boundary scan test, which, however, presented the following problems in a conventional semiconductor device in which common chips are integrally sealed.

That is, an integrally sealed arrangement of multiple chips would require large numbers of (e.g., 5) signal lines to perform the boundary scan test, which results in increased pin number and in turn increased test pattern length on the substrate. Also, the test needs to be performed for the number of chips provided.

In the foregoing arrangement of the present invention, there are provided a test signal input terminal for receiving an externally supplied test signal, a test result output terminal for outputting a test result of the plurality of chips to outside, and control signal input terminals for receiving externally supplied test control signals, and the test signal inputted from the test signal input terminal is successively transferred through the plural chips and the test control signals inputted from the control signal input terminals are individually supplied to each of the plural chips.

With this arrangement, the test signal input terminal, test result output terminal, and control signal input terminals are not required to be provided for each chip, making it possible to minimize the required number of the input and output terminals. As a result, the test can be carried out accurately and only once with a smaller number of pins with respect to the plurality of integrally sealed chips.

Further, another semiconductor device of the present invention includes:

a plurality of chips, which are integrally sealed;

a test signal input terminal for receiving an externally supplied test signal;

a test result output terminal for outputting a test result of the plurality of chips to outside; and control signal input terminals for receiving externally supplied test control signals, only one of the plurality of chips being connected to the test signal input terminal, to the test result output terminal, and to the control signal input terminals, the test signal being inputted to the one of the plurality of chips and successively transferred through the other chips, and after being inputted again into the one of the plurality of chips, outputted as the test result to outside, and the test control signals being individually supplied from the one of the plurality of chips to each of the other chips.

With this arrangement, an externally inputted test signal and test control signal are inputted to one of the plural chips. The test signal is then successively transferred from this single chip through the other chips, and after being inputted again to the single chip, outputted to outside as a test result. Meanwhile, the test control signals are individually supplied to each of the other chips from the single chip.

With this arrangement, the test signal input terminal, test result output terminal, and control signal input terminals are not required to be provided for each chip, thus accurately carrying out the test only once with a smaller number of pins with respect to the plurality of integrally sealed chips.

Further, with the foregoing arrangement, an externally supplied signal is directly given to only one of the multiple chips. Thus, by sharing the test circuit of this single chip with the other chips, it is not required to individually provide the test circuit for the other chips. As a result, the number of gates and chip area of the other chips, as well as the number of manufacturing steps can be reduced.

For a fuller understanding of the nature and advantages of the invention, reference should be made to the ensuing detailed description taken in conjunction with the accompanying drawings.

DESCRIPTION OF THE EMBODIMENTS

Figure 1:
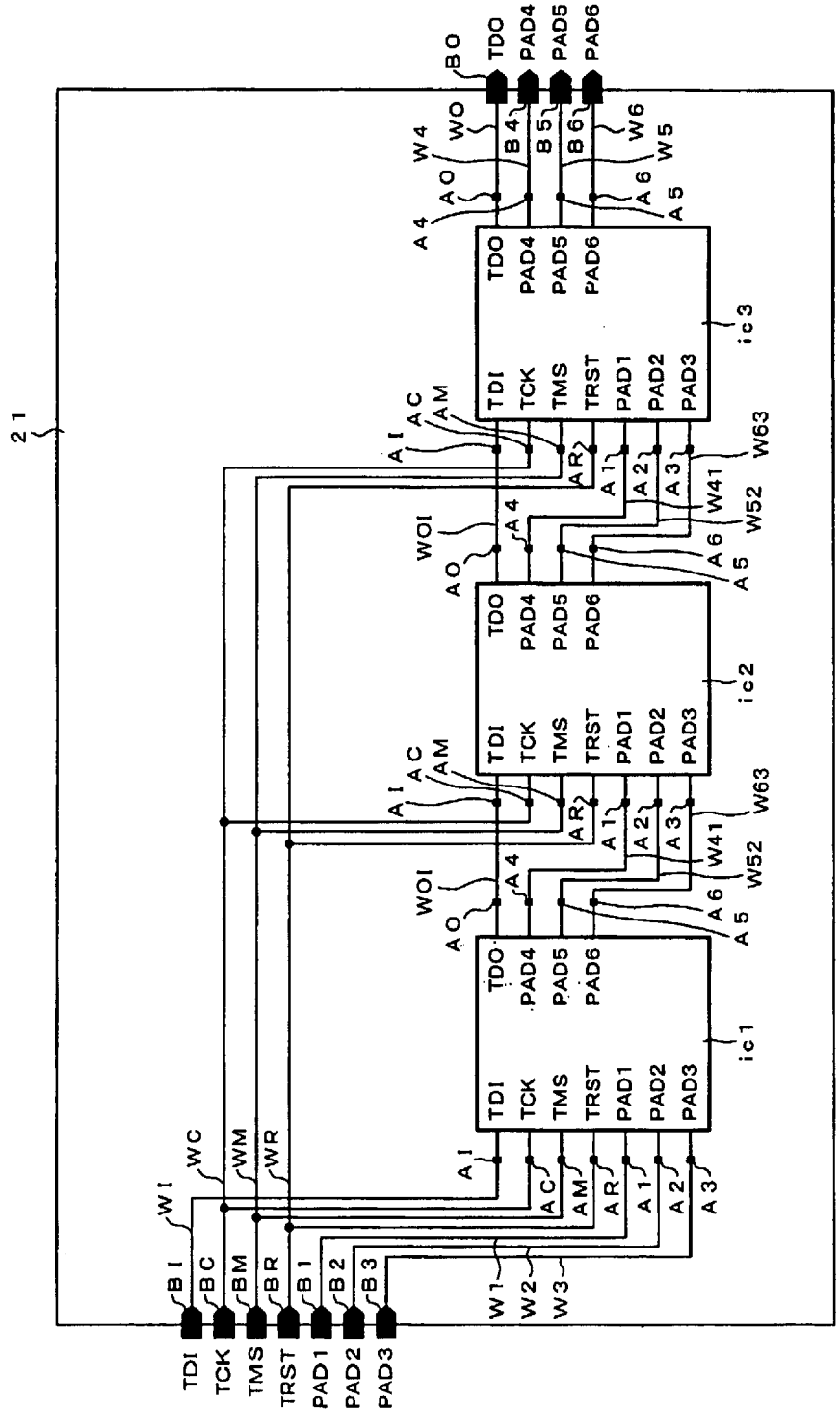
FIG. 1 is an electrical circuit diagram in a stacked device as a semiconductor device in accordance with one embodiment of the present invention.
Figure 2:
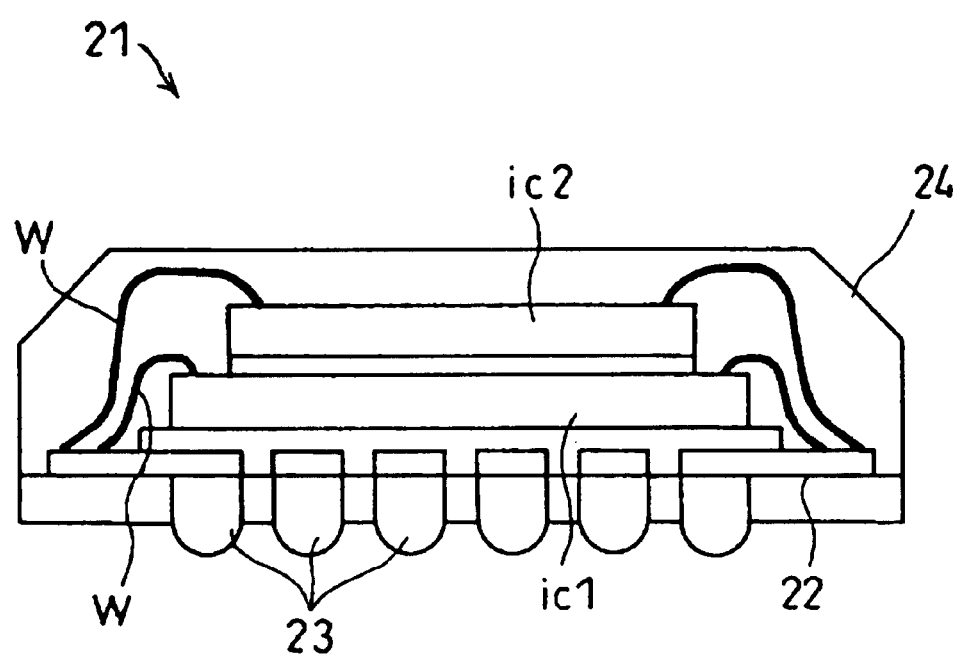
FIG. 2 is a cross sectional view showing one example of a structure of the stacked device as shown in FIG. 1 and FIG. 5.
Figure 6:
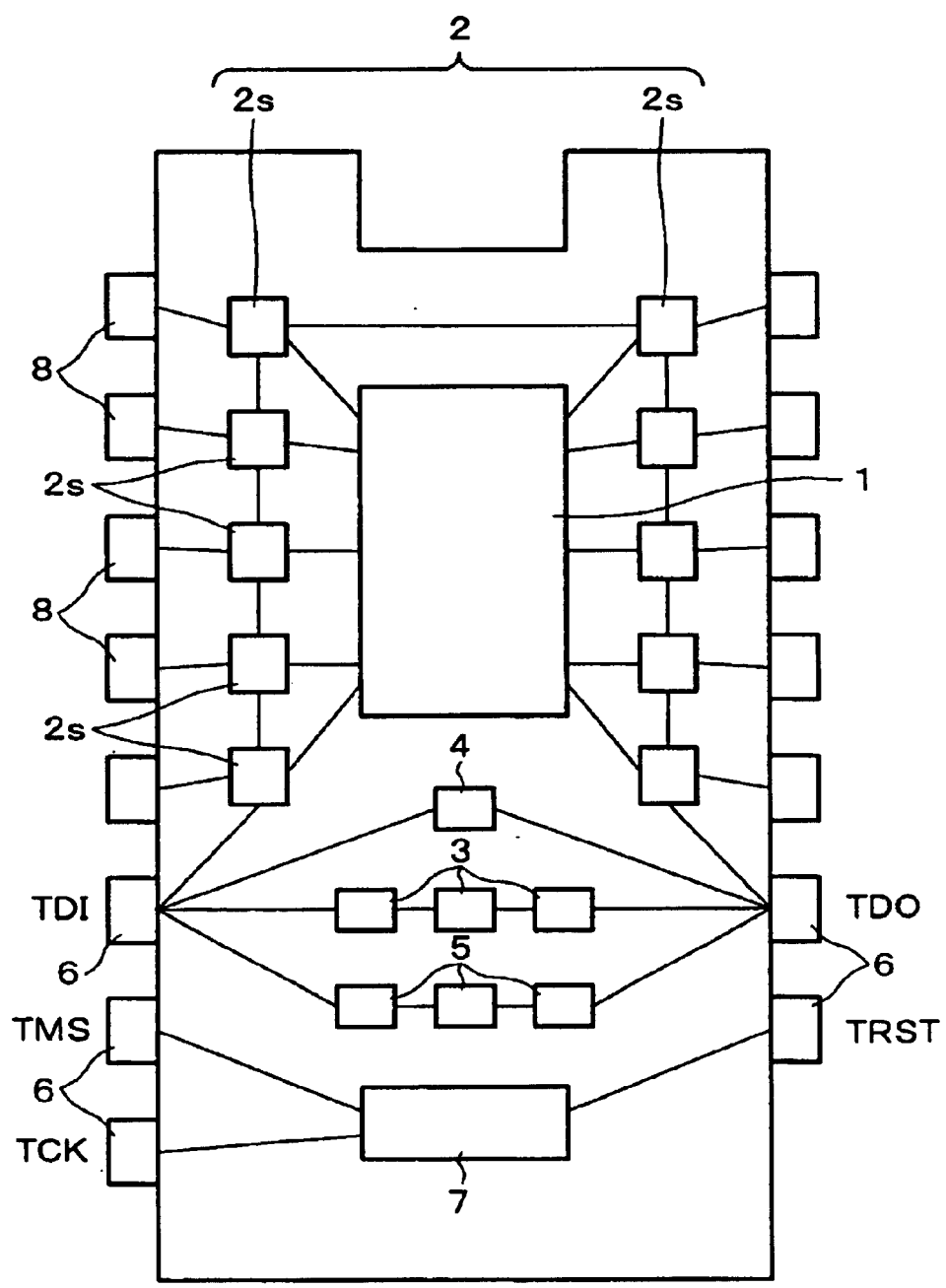
FIG. 6 is a block diagram showing one example of a device which is compatible with the boundary scan test.

The following will describe one embodiment of the present invention referring to FIG. 1, FIG. 2 and FIG. 6.

FIG. 1 is an electrical circuit diagram in a stacked device 21, which is a semiconductor device of one embodiment of the present invention. In the stacked device 21 are provided a plurality of chips ic1, ic2, and ic3 (will be indicated by reference symbol "ic" when referring to the chips in general) which are sealed integrally. Each chip ic includes, in addition to a core logic 1 as shown in FIG. 6 for realizing an intended function of the device, BSR 2, instruction register 3, bypass register 4, option register 5, TAP 6 for controlling these elements, and TAPC 7 for controlling the TAP 6. The core logic 1 may have any arrangement.

Pads AC, AM, and AR of each chip ic, respectively corresponding to signal lines TCK, TMS, and TRST, are connected, parallel to each other, via wires WC, WM, and WR, to their corresponding pins BC, BM, and BR of the stacked device 21. With regard to pads AI and AO corresponding to signal lines TDI and TDO, respectively, pad AO corresponding to the signal line TDO and pad AI corresponding to the signal line TDI are successively and serially connected to each other via wire WOI connecting the chips between devices of preceding and following stages, and pad AI corresponding to the signal line TDI of the chip ic1 of the first stage and pad AO corresponding to the signal line TDO of the chip ic3 of the last stage are connected to their corresponding pins BI and BO, respectively.

Likewise, with regard to pads A1, A2, and A3, and pads A4, A5, and A6, respectively corresponding to signal lines PAD1, PAD2, and PAD3, and signal lines PAD 4, PAD5, and PAD6 for the common core logic 1, the pads A4, A5, and A6, respectively corresponding to the output signal lines PAD4, PAD5, and PAD 6 of the chip of a preceding stage are connected, parallel to each other, via wires W41, W52, and W63 connecting the chips, to the pads A1, A2, and A3, respectively corresponding to the input signal lines PAD1, PAD2, and PAD 3 of the chip of the following stage, respectively.

Further, the pads A1, A2, and A3, respectively corresponding to the input signal lines PAD1, PAD2, and PAD3 of the chip ic1 of the first stage are connected, parallel to each other, via wires W1, W2, and W3 connecting the chips, to their corresponding pins B1, B2, and B3, respectively. The pads A4, A5, and A6, respectively corresponding to the output signal lines PAD4, PAD5, and PAD6 of the chip ic3 of the last stage are connected, parallel to each other, via wires W4, W5, and W6, to their corresponding pins B4, B5, B6, respectively.

Namely, the semiconductor device of the present embodiment includes a plurality of chips ic which are integrally sealed, a test signal input terminal (pin BI) for receiving an externally supplied test signal, a test result output terminal (pin BO) for outputting the test result of the plural chips ic to outside, and control signal input terminals (pins BC, BM, and BR) for receiving externally supplied test control signals. The test signal inputted from the test signal input terminal (pin BI) is successively transferred through the plural chips ic, whereas test control signals inputted from the control signal input terminals (pin BC, BM, and BR) are individually supplied to each chip ic.

Figure 7:
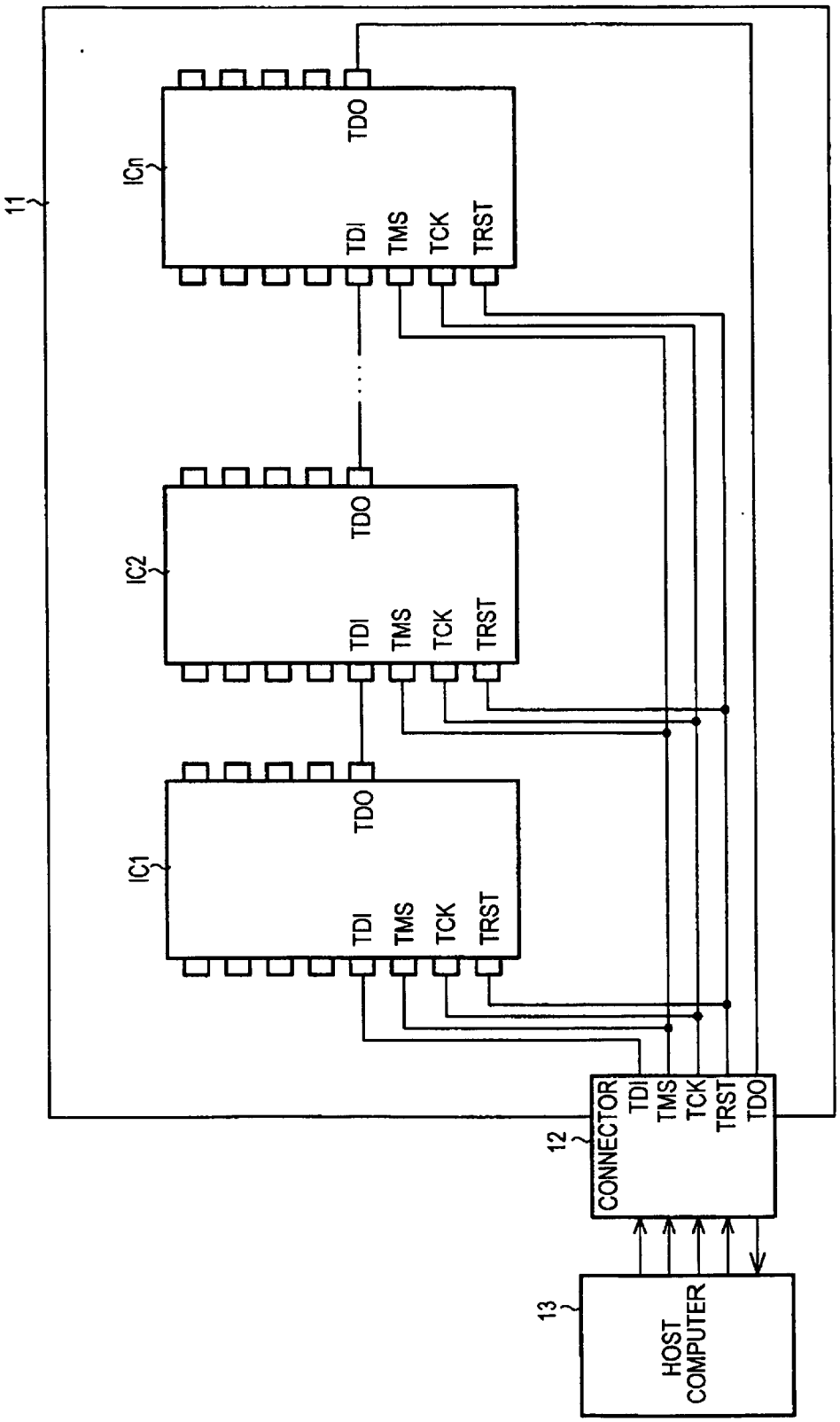
FIG. 7 is a block diagram explaining a method of a conventional boundary scan test.

The stacked device 21 structured as above is mounted as the device IC1 or IC2 as shown in FIG. 7 on a substrate 11 to be subjected to a test, and TAP 6 of each chip is controlled by a host computer 13 so as to carry out the boundary scan test all at once with respect to all the chips ic in the stacked device 21. Note that, a discrete function test of each chip ic is individually carried out one after another for each chip ic using pins B1 to B6, etc.

In this manner, the test commands/data input and output pins BI and BO and input pins BC, BM, and BR of signals to be used in a test of the device can be provided with the minimum required number of 4 (when omitting BR) or 5, thus carrying out the test with a smaller number of pins and reducing a test pattern length on the print substrate 11. Further, a test needs to be carried out only once.

FIG. 2 is a cross section showing one example of a structure of the stacked device 21. Note that, even though FIG. 1 described the case of three chips ic1, ic2, and ic3, for convenience of explanation, only two chips are provided in FIG. 2. The stacked device 21 is a semiconductor device of a BGA structure in which two chips ic1 and ic2 are stacked on one surface of a substrate 22 and solder bump 23 is provided in a matrix on the other surface of the substrate 22. The chips ic1 and ic2 are connected to each other by a pad on the substrate 22 and wire W, and to the solder bump 23 via a pattern on the substrate 22. The chips ic1 and ic2 are integrally sealed air-tight by mold resin 24.

In this manner, in the stacked device 21, two chips ic1 and ic2 are stacked on one surface of the substrate 22, and the chips ic1 and ic2 can be connected to each other by wire WOI, W41, W52, or W63.

Figure 3:
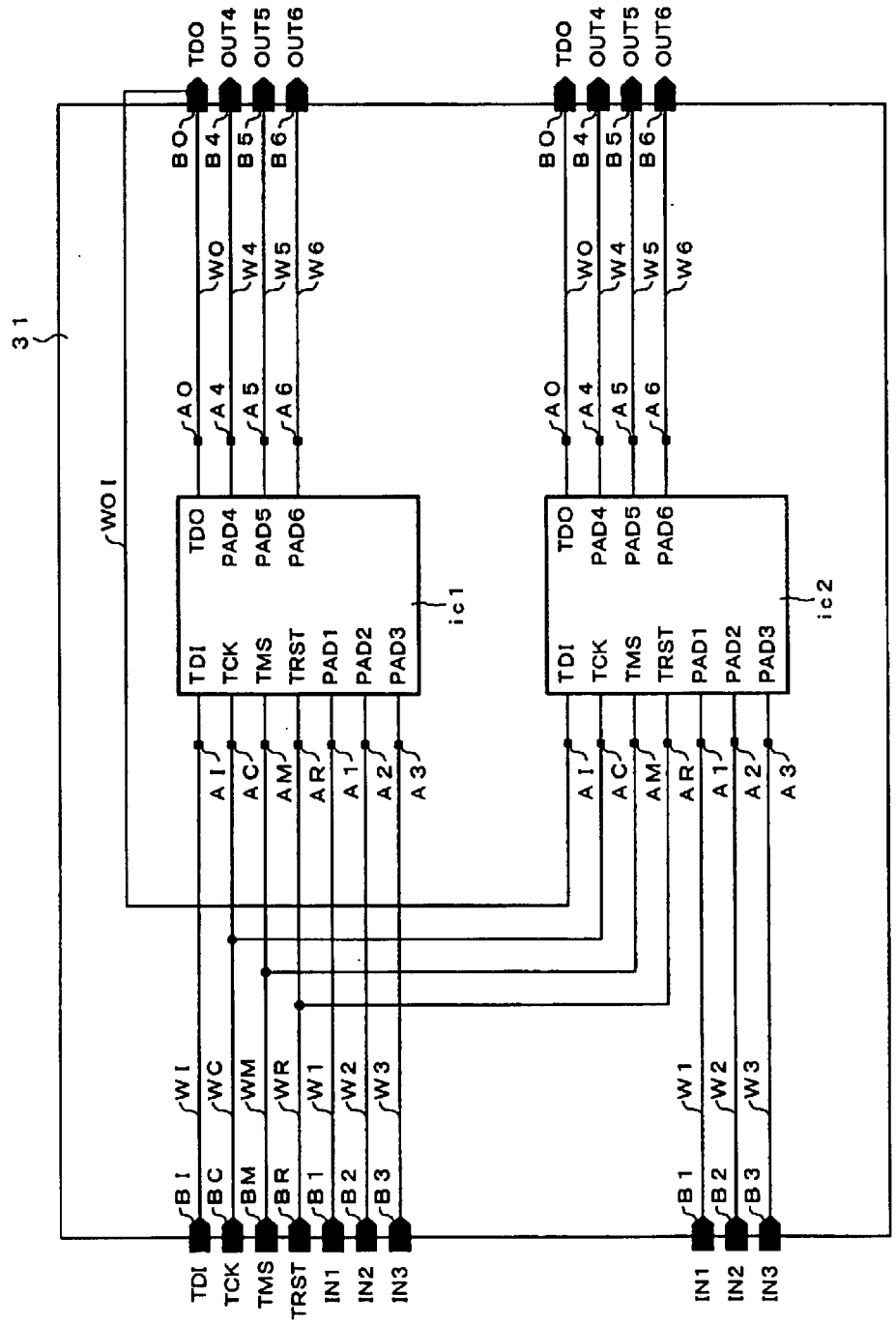
FIG. 3 is an electrical circuit diagram in a stacked device as a semiconductor device in accordance with another embodiment of the present invention.
Figure 4:
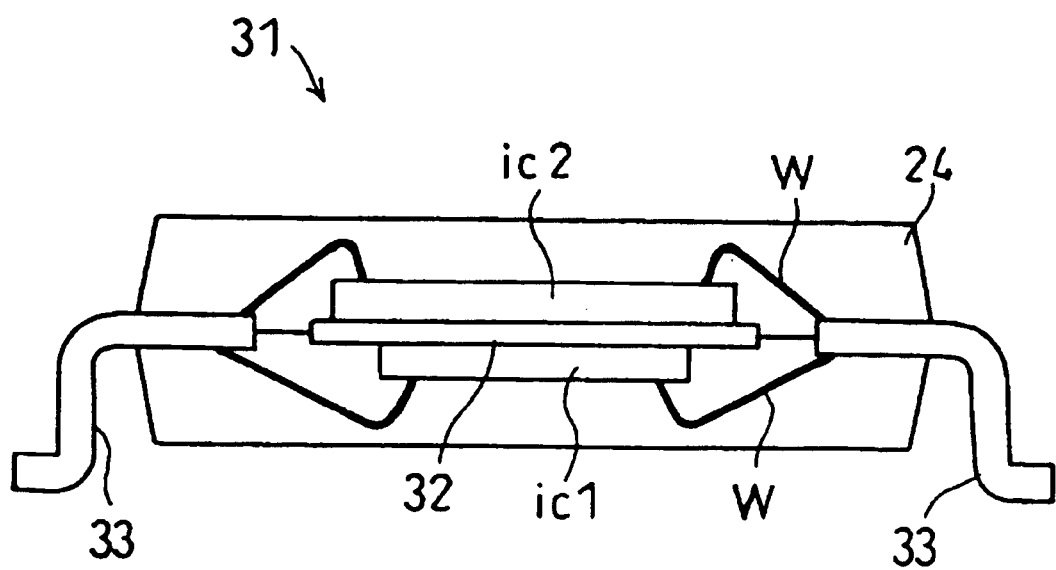
FIG. 4 is a cross sectional view showing one example of a structure of the stacked device as shown in FIG. 3.

The following will describe another embodiment of the present invention referring to FIG. 3, FIG. 4, and FIG. 6.

FIG. 3 is an electrical circuit diagram in a stacked device 31, which is a semiconductor device of another embodiment of the present invention. The stacked device 31 is analogous to the foregoing stacked device 21, and thus corresponding parts or elements are given the same reference numerals and explanations thereof are omitted here. As in FIG. 6 and FIG. 1, the chips ic1 and ic2 each includes, in addition to the core logic 1 for realizing an intended function of the device, BSR2, instruction register 3, bypass register 4, option register 5, TAP 6 for controlling these elements, and TAPC 7 for controlling the TAP 6, along with other elements.

In each chip ic, pads AC, AM, and AR, respectively corresponding to signal lines TCK, TMS, and TRST are connected, parallel to each other, via wires WC, WM, and WR, to their corresponding pins BC, BM, and BR of the stacked device 31. Further, pad AO corresponding to the signal line TDO is connected via wire WO to pin BO, which is individually provided for each of the chips ic1 and ic2, and a boundary scan test output is serially outputted therefrom. Meanwhile, with regard to pad AI which corresponds to signal line TDI, a pad AI corresponding to signal line TDI of the chip ic1 of the first stage is connected via wire W1 to its corresponding pin BI, whereas a pad AI corresponding to signal line TDI of the chip ic2 of the following stage is connected via wire WOI to pin BO which corresponds to signal line TDO of the chip ic1 of the preceding stage.

Further, pads A1, A2, and A3, and pads A4, A5, and A6, respectively corresponding to the signal lines PAD1, PAD2, and PAD3 and signal lines PAD4, PAD5, and PAD6 for the common core logic 1 of each chip ic are connected, parallel to each other, via wires W1, W2, and W3, and wires W4, W5, and W6, to the pins B1, B2, and B3 and pins B4, B5, and B6, respectively, which are separately provided.

In this manner, even in cases where the chips cannot be directly connected to each other, by connecting the chips via pin BO, it is possible, though it is required to provide the test commands/data output pin BO of the device for each of the chips ic1 and ic2, to provide the other test commands/data input pin BI and input pins BC, BM, and BR of signals to be used in a test with the minimum required number of 3 (when omitting BR) or 4, thus carrying out the test with a smaller number of pins and reducing a test pattern length on the print substrate 11. Further, the test needs to be carried out only once.

FIG. 4 is a cross section showing one example of a structure of the stacked device 31. The stacked device 31 is a semiconductor device of a DIL (Dual In Line) structure in which chips ic1 and ic2 are stuck on the front and back surfaces of a substrate 32, respectively, and pins 33 are disposed in a row from the both ends of the pair of the chips ic1 and ic2. Due to this structure, unlike the foregoing structure, the chips ic1 and ic2, respectively on the front and back surfaces of the substrate 32, cannot be connected to each other by wire, and thus the chips ic1 and ic2 are connected to each other via test commands/data output pin BO. Also, the chips ic1 and ic2 are integrally sealed air-tight by mold resin 24.

Figure 5:
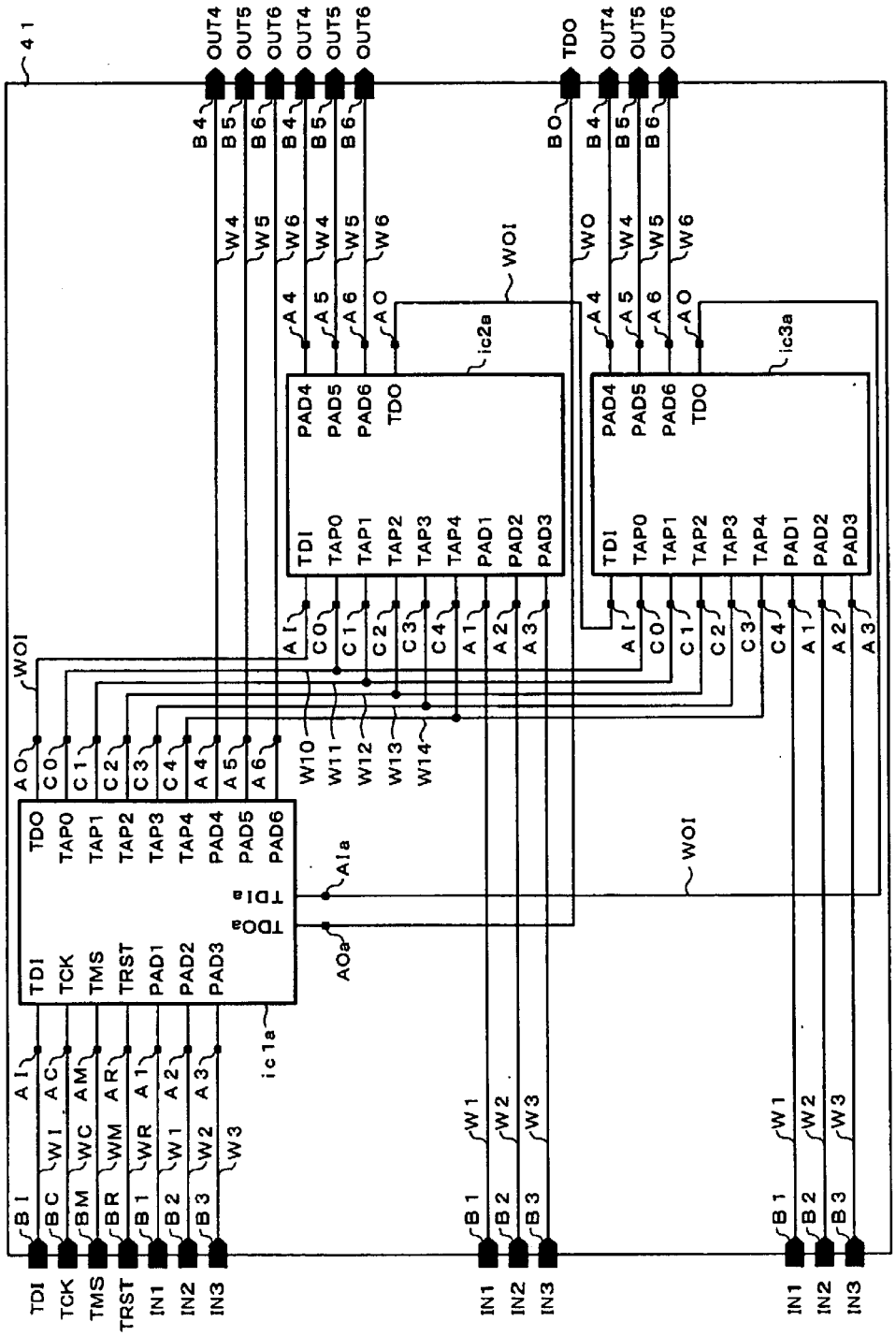
FIG. 5 is an electrical circuit diagram in a stacked device as a semiconductor device in accordance with yet another embodiment of the present invention.

The following will describe yet another embodiment of the present invention referring to FIG. 5 and FIG. 2.

FIG. 5 is an electrical circuit diagram in a stacked device 41, which is a semiconductor device of yet another embodiment of the present invention. The stacked device 41 is analogous to the foregoing stacked devices 21 and 31, and corresponding parts or elements will be given the same reference numerals and explanations thereof are omitted here. The chips ic1a, ic2a, and ic3a of the stacked device 41 are the same as the foregoing chips ic1, ic2, and ic3 in the structure where the BSR2 and TAP 6 are provided for each chip in addition to the core logic 1 for realizing an intended function of the device, as shown in FIG. 6, yet they are different with regard to TAPC 7, instruction register 3, bypass register 4, and option register 5, etc., which are not provided on the chips ic2a and ic3a of the second and subsequent stages, but are provided only on the chip ic1a of the first stage.

Thus, the chip ic1a is provided with relay signal lines TDIa and TDOa of the signal lines TDI and TDO, and output signal lines TAP0, TAP1, TAP2, TAP3, and TAP4 corresponding to the signal lines TCK, TMS, and TRST. The chips ic2a and ic3a are each provided with signal lines TDI and TDO, as well as signal lines TAP0, TAP1, TAP2, TAP3, and TAP4.

Pads AI, AC, AM, and AR of the chip ic1a of the first stage, respectively corresponding to the signal lines TD1, TCK, TMS, and TRST are connected, parallel to each other, via wires WI, WC, WM, and WR, to their corresponding pins BI, BC, BM, and BR of the stacked device 41. Pad AOa which corresponds to the relay signal line TDOa is connected to pin BO via wire WO.

Meanwhile, pads C0, C1, C2, C3, and C4, respectively corresponding to signal lines TAP0, TAP1, TAP2, TAP3, and TAP4 are connected, parallel to each other, via wires W10, W11, W12, W13, and W14, to their corresponding pads C0, C1, C2, C3, and C4 of the signal lines TAP0, TAP1, TAP2, TAP3, and TAP4 of the chips ic2a and ic3a, respectively.

Further, pad AO corresponding to signal line TDO is connected, via wire WOI connecting the chips, to pad AI which corresponds to signal line TDI of the chip ic2a, and similarly, pad AO corresponding to signal line TDO of the chip ic2a is connected, via wire WOI connecting the chips, to pad AI which corresponds to signal line TDI of the chip ic3a. Also, pad AO corresponding to signal line TDO of the chip ic3a is connected, via wire WOI connecting the chips, to pad AIa which corresponds to signal line TDIa of the chip ic1a. Thus, the test commands/data output and input signal lines TDO and TDI are connected to each other in the form of a loop.

The pads A1, A2, and A3 and pads A4, A5, and A6, respectively corresponding to the signal lines PAD1, PAD2, and PAD3 and signal lines PAD4, PAD5, and PAD6 for the common core logic 1 of each chip ic are connected, parallel to each other, via wires W1, W2, and W3 and wires W4, W5, and W6, to the pins B1, B2, and B3 and pins B4, B5, and B6, respectively, which are separately provided.

Namely, the semiconductor device of the present embodiment includes a plurality of chips which are integrally sealed, test signal input terminal (pin BI) for receiving an externally supplied test signal, test result output terminal (pin BO) for outputting the test result of the plural chips ic to outside, and control signal input terminals (pins BC, BM, and BR) for receiving externally supplied test control signals. Among the plural chips ic, only the chip ic1a is connected to the test signal input terminal (pin BI), to the test result output terminal (pin BO), and to the control signal input terminals (pins BC, BM, and BR). Further, the test signal is inputted to the chip ic1a, and successively transferred through the other chips, and after being inputted again into the chip ic1a, outputted as a test result to outside. Meanwhile, the test control signals are individually supplied to the other chips from the chip ic1a.

In the stacked device 41 structured as above, the TAP6 of each chip ic is controlled by way of TAPC 7 of the chip ic1a by the host computer 13 as shown in FIG. 7 so as to perform the boundary scan test all at once with respect to all the chips ic in the stacked device 41.

In this manner, the test commands/data input and output pins BI and BO and input pins BC, BM, and BR of signals to be used in a test of the device can be provided with the minimum required number of 4 (when omitting BR) or 5, thus carrying out the test with a smaller number of pins and reducing a test pattern length on the print substrate 11. Further, the test needs to be carried out only once.

Further, since the TAPC 7, instruction register 3, bypass register 4, and option register 5, etc., are shared between the plurality of chips, the number of gates of the chips ic2a and ic3a can be reduced, thereby reducing the chip area and the number of manufacturing steps. For example, the number of gates a single TAPC possesses is equivalent to twenty to thirty BSRs, and thus the number of gates reduced in each of the chips ic2a and ic3a is equivalent to twenty to thirty BSRs. Further, in the chips ic2a and ic3a, it is not required to provide a special circuit or pins for the boundary scan test for every core logic design, and thus the number of designing steps, which is worth about ten days for example, can be reduced.

In the stacked device 41 the chips are connected to each other, and thus the structure thereof is, for example, as shown in FIG. 2, as with the stacked device 21.

As described, the semiconductor device of the present invention, in which a plurality of semiconductor integrated circuit chips are integrally sealed, may have an arrangement including: a test register provided for each of input and output terminals of a core logic of each chip; and a control circuit for controlling the test register for testing the chip, test commands/data input and output terminals connected to the control circuit, and input terminals of signals to be used in the test, which are all mounted on each chip, a test commands/data input terminal of a device being connected to the test commands/data input terminal of a chip of a first stage, and the test commands/data output terminal of a chip of a preceding stage being serially connected to the test commands/data input terminal of a chip of a following stage, and the test commands/data output terminal of a chip of a last stage being connected to a test commands/data output terminal of the device, and input terminals of the device for the signals to be used in the test being connected to the corresponding input terminals of each chip for the signals to be used in the test.

With this arrangement, in testing, for example, by the boundary scan test, a semiconductor device in which a plurality of semiconductor integrated circuit chips are integrally sealed, each chip would mount a test register such as a BSR of a boundary scan test compatible chip, and a control circuit such as TAPC, in addition to test commands/data input and output terminals such as TDI and TDO, and input terminals of signals to be used in the test, such as TCK, TMS, and TRST.

The test commands/data input terminal of the device is connected to the test commands/data input terminal of the chip of the first stage, and the test commands/data output terminal of the chip of the last stage is connected to the test commands/data output terminal of the device, and the test commands/data output terminal and test commands/data input terminal are serially connected between chips of preceding and following stages within the device, utilizing the connections between the chips, and the input terminal of the device for the signal to be used in the test is connected to the corresponding input terminal of the signal of each chip.

Thus, the test commands/data input and output terminals and input terminals of a signal to be used in the test of the device can be provided with the minimum required number of 4 or 5, for example, when responding to the boundary scan test, thus carrying out the test with a smaller number of pins and reducing a test pattern length on the substrate. Further, the test needs to be carried out only once.

Further, the semiconductor device of the present invention, in which a plurality of chips are integrally sealed, may have an arrangement including: a test register provided for each of input and output terminals of a core logic of each chip; and a control circuit for controlling the test register for testing the chip, test commands/data input and output terminals connected to the control circuit, and input terminals of signals, connected to the control circuit, to be used in the test, which are all mounted on each chip, a test commands/data input terminal of a device being connected to the test commands/data input terminal of a chip of a first stage, and the test commands/data output terminal of each chip being connected to a corresponding output terminal of the device and serially to the test commands/data input terminal of a chip of a following stage via the output terminal of the device, and input terminals of the device for the signals to be used in the test being connected to the corresponding input terminals of each chip for the signals to be used in the test.

With this arrangement, in testing, for example, by the boundary scan test, a semiconductor device in which a plurality of semiconductor integrated circuit chips are integrally sealed, each chip would mount a test register such as a BSR of a boundary scan test compatible chip, and a control circuit such as TAPC, in addition to test commands/data input and output terminals such as TDI and TDO, and input terminals of signals to be used in the test, such as TCK, TMS, and TRST.

The test commands/data input terminal of the device is connected to the test commands/data input terminal of the chip of the first stage, and the test commands/data output terminal of each chip is connected to the test commands/data output terminal of the device, and due to the structure which prevents a direct connection between the chips, the test commands/data output terminal and test commands/data input terminal are serially connected to each other between the chips of preceding and following stages, and the input terminal of the device for a signal to be used in the test is connected to the corresponding input terminal of the signal of each chip.

Thus, even though the test commands/data output terminal of the device needs to be provided for the number of chips provided in cases where the chips cannot be directly connected to each other, the test commands/data input terminal and input terminal of a signal to be used in the test of the device can be provided with the minimum required number of 3 or 4, for example, when responding to the boundary scan test, thus carrying out the test with a smaller number of pins and reducing a test pattern length on the substrate. Further, the test needs to be carried out only once.

Further, the semiconductor device of the present invention, in which a plurality of semiconductor integrated circuit chips are integrally sealed, may have an arrangement including: a test register provided for each of input and output terminals of a core logic of each chip; and a control circuit for controlling the test register for testing the chip, test commands/data relay input and output terminals connected to the control circuit, and output terminals of signals to be used in the test outputted from the control circuit, which are all mounted on a chip of a first stage, test commands/data input and output terminals of a device being respectively connected to the test commands/data input and output terminals of the chip of the first stage, and the relay output terminal of the chip of the first stage being connected to a test commands/data input terminal of a chip of a following stage, and a test commands/data output terminal and a test commands/data input terminal being serially and successively connected between chips of a preceding stage and a following stage, and a test commands/data output terminal of a chip of a last stage being connected to the relay input terminal of the chip of the first stage so as to form a loop, and the output terminals of the chip of the first stage for the signals to be used in the test being connected to input terminals of the other chips for the signals to be used in the test.

With this arrangement, in testing, for example, by the boundary scan test, a semiconductor device in which a plurality of semiconductor integrated circuit chips are integrally sealed, each chip would mount a test register such as a BSR of a boundary scan test compatible chip, in addition to test commands/data input and output terminals such as TDI and TDO, and input terminals of signals to be used in the test, such as TCK, TMS, and TRST.

The control circuit such as TAPC is mounted only on the chip of the first stage. Accordingly, the chip of the first stage would mount test commands/data relay input and output terminals and output terminals of test signals outputted from the control circuit, and the test signal is distributed from the chip of the first stage to the other chip, using the connections between the chips. With regard to test commands and data, the relay output terminal of the chip of the first stage is connected to the test commands/data input terminal of the chip of the following stage using the connection between the chips, and the test commands/data output terminal and test commands/data input terminal are serially connected to each other between the chips of preceding and following stages, and the test commands/data output terminal of the chip of the last stage is connected to the relay input terminal of the chip of the first stage so as to form a loop, thereby supplying the test commands and data to each chip.

Thus, the test commands/data input and output terminals and input terminal of a signal to be used in the test of the device can be provided with the minimum required number of 4 or 5, for example, when responding to the boundary scan test, thus carrying out the test with a smaller number of pins and reducing a test pattern length on the substrate. Further, the test needs to be carried out only once. Further, the control circuit which is common to the plurality of chips only needs to be provided on the chip of the first stage, thus reducing the number of the other chips and in turn chip area, as well as the number of manufacturing steps.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:

a plurality of chips, which are integrally sealed air-tight;

a test signal input terminal for receiving an externally supplied test signal;

a test result output terminal for outputting a test result of said plurality of chips to outside; and control signal input terminals for receiving externally supplied test control signals, the test signal inputted from said test signal input terminal being successively transferred through said plurality of chips, and the test control signals inputted from said control signal input terminals being individually supplied to each of said plurality of chips, wherein said plurality of chips are connected to each other via said test result output terminal.

2. The semiconductor device as set forth in claim 1, wherein said plurality of chips are stacked, such that at least two of the chips substantially overlap.

3. A semiconductor device, comprising:

a plurality of chips, which are integrally sealed air-tight;

a test signal input terminal for receiving an externally supplied test signal;

a test result output terminal for outputting a test result of said plurality of chips to outside; and control signal input terminals for receiving externally supplied test control signals, only one of said plurality of chips being connected to said test signal input terminal, to said test result output terminal, and to said control signal input terminals, the test signal being inputted to the one of said plurality of chips and successively transferred through the other chips, and after being inputted again into the one of said plurality of chips, outputted as the test result outside, and the test control signals being individually supplied from the one of said plurality of chips to each of the other chips.

4. The semiconductor device as set forth in claim 3 wherein only the one of said plurality of chips includes a controller for controlling an input/output interface of the test signal.

5. The semiconductor device as set forth in claim 3, wherein said plurality of chips are stacked, such that at least two of the chips are stuck on front and back surfaces of a substrate, respectively.

6. A semiconductor device in which a plurality of chips are integrally sealed air-tight, comprising:

a test register provided between a core logic and each of input and output terminals of each chip; and a control circuit for controlling said test register for testing the chip, test commands/data input and output terminals connected to said control circuit, and input terminals of signals, connected to said control circuit, to be used in the test, which are all mounted on each chip, a test commands/data input terminal of a device being connected to the test commands/data input terminal of a chip of a first stage, and the test commands/data output terminal of a chip being connected to a corresponding output terminal of the device and serially to the test commands/data input terminal of a chip of a following stage via the output terminal of the device, and input terminals of the device for the signals to be used in the test being connected to the corresponding input terminals of the signals of each chip.

7. A semiconductor device in which a plurality of chips are integrally sealed air-tight, comprising:

a test register provided between a core logic and each of input and output terminals of each chip; and a control circuit for controlling the test register for testing the chip, test commands/data relay input and output terminals connected to said control circuit, and output terminals of signals to be used in the test outputted from the control circuit, which are all mounted on a chip of a first stage, test commands/data input and output terminals of a device being respectively connected to the test commands/data input and output terminals of the chip of the first stage, and the relay output terminal of the chip of the first stage being connected to a test commands/data input terminal of a chip of a following stage, and a test commands/data output terminal and a test commands/data input terminal being serially and successively connected between chips of a preceding stage and a following stage, and a test commands/data output terminal of a chip of a last stage being connected to the relay input terminal of the chip of the first stage so as to form a loop, and the output terminals of the chip of the first stage for the signals to be used in the test being connected to input terminals of the signals of the other chips.

8. A semiconductor device, comprising:

a plurality of chips, which are integrally sealed air-tight;

a test signal input pin for receiving an externally supplied test signal;

a test result output pin for outputting a test result of said plurality of chips to outside; and control signal input pins for receiving externally supplied test control signals, the test signal inputted from said test signal input pin being successively transferred through said plurality of chips connected with each other by wires sealed with said plurality of chips, and the test control signals inputted from said control signal input pins being individually supplied to each of said plurality of chips via wires sealed with the plurality of chips, wherein said plurality of chips are connected to each other via said test result output pin.

9. A semiconductor device, comprising:

a plurality of chips, which are integrally sealed air-tight;

a test signal input pin for receiving an externally supplied test signal;

a test output pin for outputting a test result of said plurality of chips to outside; and control signal input pins for receiving externally supplied test control signals, only one of said plurality of chips being connected to said test signal input pin, to said test result output pin, and to said control signal input pins, the test signal being inputted to the one of said plurality of chips and successively transferred through the other chips so connected to each other by wires sealed with the plurality of chips, and after being inputted again into the one of said plurality of chips, outputted as the test result to outside, and the test control signals being individually supplied from the one of said plurality of chips to each of the other chips via wires sealed with the plurality of chips.

10. The semiconductor device as set forth in claim 9, wherein only the one of said plurality of chips includes a controller for controlling an input/output interface of the test signal.

11. A semiconductor device in which a plurality of chips are integrally sealed air-tight, comprising:

a test register provided between a core logic and each of input and output terminals of each chip; and a control circuit for controlling said test register for testing the chip, test commands/data input and output pads connected to said control circuit, and input pads of signals, connected to said control circuit, to be used in the test, which are all mounted on each chip, wherein a test commands/data input pin of a device is connected to the test commands/data input pad of a chip of a first stage, and the test commands/data output pad of each chip is connected to a corresponding output pins of the device and serially to the test commands/data input terminal of a chip of a following stage via one of the output pins of the device, and input pins of the device for the signals to be used in the test is connected to the corresponding input pins of the signals of each chip, connection being performed via wires sealed with the plurality of chips.

12. A semiconductor device in which a plurality of chips are integrally sealed air-tight, comprising:

a test register provided between a core logic and each of input and output terminals of each chip; and a control circuit for controlling the test register for testing the chip, test commands/data relay input and output pads connected to said control circuit, and output pads of signals to be used in the test outputted from the control circuit, which are all mounted on a chip of a first stage, wherein test commands/data input and output pins of a device is respectively connected to the test commands/data input and output pads of the chip of the first stage, and the relay output pad of the chip of the first stage is connected to a test commands/data input pad of a chip of a following stage, and a test commands/data output pad and a test commands/data input pad is serially and successively connected between chips of a preceding stage and a following stage, and a test commands/data output pad of a chip of a last stage is connected to the relay input pad of the chip of the first stage so as to form a loop, and the output pads of the chip of the first stage for the signals to be used in the test is connected to input pads of the signals of the other chips, connection being performed via wires sealed with the plurality of chips.

* * * * *